(12) United States Patent
Chia et al.

(10) Patent No.: US 10,255,961 B2
(45) Date of Patent: Apr. 9, 2019

(54) DATA STORAGE IN SYNTHETIC ANTIFERROMAGNETS INCLUDED IN MAGNETIC TUNNEL JUNCTIONS

(71) Applicant: Everspin Technologies, Inc., Chandler, AZ (US)

(72) Inventors: Han-Jong Chia, Chandler, AZ (US); Sumio Ikegawa, Phoenix, AZ (US); Michael Tran, Woodlands (SG); Jon Slaughter, Albany, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/851,816

(22) Filed: Dec. 22, 2017

(65) Prior Publication Data
US 2018/0182443 A1 Jun. 28, 2018

Related U.S. Application Data (60) Provisional application No. 62/439,183, filed on Dec. 27, 2016.

(51) Int. Cl.
| | |
|---|---|
| *G11C 11/16* | (2006.01) |
| *H01L 43/08* | (2006.01) |
| *H01L 43/02* | (2006.01) |
| *H01L 43/12* | (2006.01) |
| *H01F 10/32* | (2006.01) |

(Continued)

(52) U.S. Cl.
CPC ........ *G11C 11/1675* (2013.01); *G11C 11/161* (2013.01); *G11C 11/1659* (2013.01); *G11C 11/1673* (2013.01); *G11C 11/5607* (2013.01); *H01F 10/329* (2013.01); *H01F 10/3272* (2013.01); *H01F 10/3286* (2013.01);
(Continued)

(58) Field of Classification Search
CPC .................. G11C 11/1659; G11C 11/1675
See application file for complete search history.

(56) References Cited

U.S. PATENT DOCUMENTS

| | | |
|---|---|---|
| 7,339,819 B2 | 3/2008 | Johnson |
| 9,019,754 B1 | 4/2015 | Bedeschi |

(Continued)

FOREIGN PATENT DOCUMENTS

| | | |
|---|---|---|
| EP | 1 061 592 A2 | 12/2000 |

OTHER PUBLICATIONS

International Search Report and Written Opinion dated May 18, 2018, in International Application No. PCT/US2017/066989 (19 pages).

*Primary Examiner* — Hoai V Ho
*Assistant Examiner* — Jay Radke
(74) *Attorney, Agent, or Firm* — Bookoff McAndrews, PLLC (57) ABSTRACT

A magnetoresistive memory device that stores data in the synthetic antiferromagnet (SAF) included in each spin-torque memory cell provides for more robust data storage. In normal operation, the memory cells use the free portion of the memory cell for data storage. Techniques for storing data in the reference portions of memory cells are presented, where an unbalanced SAF that includes ferromagnetic layers having different magnetic moments is used to lower the switching barrier for the SAF and allow for writing data values to the SAF using lower currents and magnetic fields than would be required for a balanced SAF.

20 Claims, 7 Drawing Sheets

(51) Int. Cl.
*H01L 43/10* (2006.01)
*G11C 11/56* (2006.01)

(52) U.S. Cl.
CPC .............. *H01L 43/02* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 9,140,747 B2 | 9/2015 | Kim et al. | |
| 9,576,636 B1* | 2/2017 | Slaughter | G11C 11/1675 |
| 9,793,003 B2 | 10/2017 | Abedifard et al. | |
| 2006/0017082 A1* | 1/2006 | Fukuzumi | B82Y 25/00 |
| | | | 257/295 |
| 2007/0097731 A1 | 5/2007 | Abraham et al. | |
| 2009/0273965 A1* | 11/2009 | Takenaga | B82Y 25/00 |
| | | | 365/158 |
| 2013/0227200 A1 | 8/2013 | Cometti et al. | |
| 2014/0008742 A1* | 1/2014 | Chen | G01R 33/098 |
| | | | 257/421 |
| 2014/0110804 A1* | 4/2014 | Han | H01L 43/08 |
| | | | 257/421 |
| 2014/0269035 A1* | 9/2014 | Manipatruni | G11C 11/1675 |
| | | | 365/158 |
| 2016/0064058 A1 | 3/2016 | Janesky et al. | |

\* cited by examiner

FIG. 11

DATA STORAGE IN SYNTHETIC ANTIFERROMAGNETS INCLUDED IN MAGNETIC TUNNEL JUNCTIONS

CROSS-REFERENCE TO RELATED APPLICATIONS

This application claims the benefits of priority to U.S. Provisional Patent Application No. 62/439,183, filed on Dec. 27, 2016, the entirety of which is herein incorporated by reference.

TECHNICAL FIELD

The disclosure herein relates generally to spin-torque magnetoresistive memory devices, and, more particularly, to storing data in such memory devices in a synthetic antiferromagnet included in a magnetic tunnel junction.

BACKGROUND

Magnetoresistive memory devices store information with stable magnetic states that result in different device resistances. For example, in certain magnetoresistive memory devices, the resistance across a magnetic tunnel junction (MTJ), and therefore the voltage drop for a specific current, depends on the relative magnetic states of the magnetic layers within the memory cell. In such memory devices, there is typically a portion of the memory cell that has a "reference" magnetic state and another portion that has a "free" magnetic state that is controlled to be either parallel or antiparallel to the reference magnetic state. Because the resistance through the memory cell changes based on whether the magnetic vector for the free portion is parallel or antiparallel to the magnetic vector for the reference portion, information can be stored by setting the magnetic orientation of the free portion. The information is later retrieved by sensing the orientation of the free portion. Such magnetic memory devices are well known in the art. As described herein, the free portion may be referred to as a "free layer" and the reference portion may be referred to as a "reference layer" even though each of the free and reference portions may be made up of many layers of both ferromagnetic and non-ferromagnetic materials.

While magnetoresistive memory devices provide non-volatile storage under many operating conditions, there is a need for more robust data storage in such devices such that the data is maintained even after the memory is exposed to adverse conditions, including the heat associated with soldering operations and/or packaging.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise" "include." "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Magnetoresistive memory is non-volatile in the sense that once a data bit is stored in a magnetoresistive memory cell, removal of power to the memory will not result in the data being lost. In some instances, it is desirable to store data within a magnetoresistive memory during production of the memory for later use in a system. For example, a magnetoresistive memory may be preprogrammed during manufacturing, where the information stored on the magnetoresistive memory is later used after the magnetoresistive memory is placed within a system. The pre-programming performed during manufacturing may occur during testing (e.g., wafer probe or burn-in) when the memory is already being exercised, and therefore a separate programming operation in the system is unnecessary.

While it is sometimes desirable to preprogram magnetoresistive memory devices during manufacturing, such preprogrammed data can sometimes be lost due to exposure to magnetic fields, high temperatures, or other conditions that can disrupt the magnetic state of the free portions of the memory cells. For example, the high temperatures associated with soldering operations when a device is mounted to a printed circuit board can result in the loss of such preprogrammed data. More specifically, solder reflow operations expose the device to temperatures on the order of 260 degrees Celsius for about five minutes, which can cause loss of preprogrammed data. Because the magnetic moment of the free layer is intended to be changed during normal read/write operations, the free layer is more susceptible to unintentional changes to its magnetic state. In contrast, the reference layer of the memory cell is designed with a much more robust magnetic structure that is intended to remain in the same magnetic state during the operations associated with reading and writing to the memory cell.

As described herein, storing data in the reference layer of a magnetic random access memory provides for more robust data storage that is less susceptible to corruption by magnetic fields, heat, etc. In specific embodiments, data is stored in a synthetic antiferromagnet (SAF) that makes up, or is included in, the reference layer. In examples presented herein, the SAF is an unpinned SAF that includes at least two ferromagnetic layers, where the ferromagnetic layers are antiferromagnetically coupled by an antiferromagnetic coupling layer. Thus, the magnetic states of the two ferromagnetic layers are oppositely oriented when in a non-saturated state. Like the free layer, the SAF can be oriented in two distinct magnetic states. In a conventional magnetoresistive random access memory, all of the magnetic states corresponding to the SAFs of the memory cells are typically aligned the same. For example, the ferromagnetic layer closest to the dielectric layer making up the tunnel junction for all of the memory cells is typically oriented in the same direction. This can be accomplished during manufacturing by applying a strong orientating magnetic field to the memory that forces all of the reference layers into the desired magnetic state. As described herein, placing some of the reference layers in one magnetic state and other reference layers in the other magnetic state enables ROM-like data storage using the reference layers while still permitting normal read/write capability utilizing the free layer in each memory cell.

Related U.S. patent application Ser. No. 15/087,469 entitled "MAGNETIC MEMORY HAVING ROM-LIKE STORAGE AND METHOD THEREFORE," which is assigned to the same assignee as the present application, provides additional details regarding storage and retrieval of data using the reference layers of magnetic tunnel junctions. Application Ser. No. 15/087,469 is incorporated by reference herein in its entirety.

As presented herein, techniques are provided for lowering the energy barrier associated with switching the SAF for each memory cell from one state to the other state. One technique changes the etch profile of the magnetic tunnel junction stack in order to create a large moment imbalance between the ferromagnetic layers included in the SAF, thereby making it easier to rotate the magnetic moments of the ferromagnetic layers and invert the magnetic state of the SAF. As such, the SAF can be inverted at lower magnetic fields and with less writing current. For example, in some embodiments the width or diameter of the lower layer of ferromagnetic material in the SAF is significantly greater than the width or diameter of the ferromagnetic layer near the tunnel junction, thereby giving the lower layer a much larger magnetic moment than the upper ferromagnetic layer. The resulting moment imbalance allows the SAF to rotate more easily and enables inversion of the magnetic state of the SAF with less magnetic field and/or less spin-torque current than would be required for a balanced SAF in which the magnetic moments of the ferromagnetic layers in the SAF are about equal. Sizing of the layers in the SAF is chosen in order to cause the magnetic fields generated by the ferromagnetic layers in the SAF to mostly or entirely cancel out from the perspective of the free layer within the magnetic tunnel junction, thereby preventing unwanted interference with free layer switching during normal operations in which data is stored in the free layers of the magnetic memory cells.

In addition to providing an unbalanced SAF for easier switching with less energy, writing data into the SAF is further aided by exposing the device to magnetic fields that place the device in a state on the cusp of switching such that only a small spin-torque current is required to push the device past the threshold and cause the SAF to invert. A relatively larger magnetic field corresponding to the easy axis for the device can be supplemented with a smaller magnetic field perpendicular to the larger magnetic field, where the smaller magnetic field serves to tip the magnetization away from the easy axis, which further lowers the required energy for switching. Thus, the larger magnetic field in the direction corresponding to the easy axis is accompanied by a "nudge" of perpendicular field that helps to encourage the magnetic moments to switch.

Figure 1:
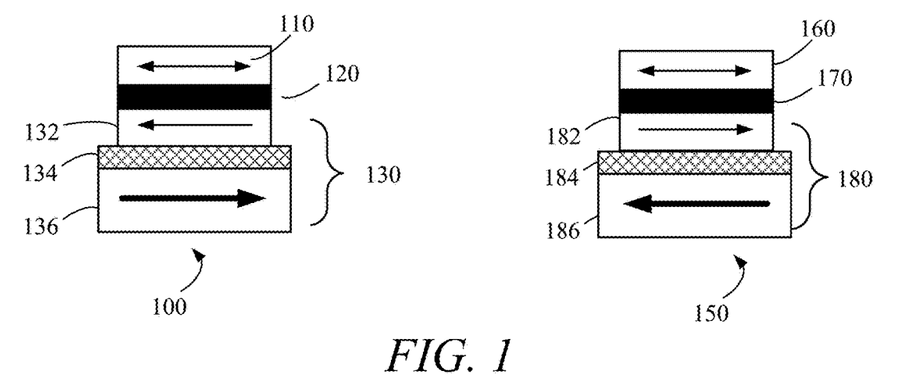
FIG. 1 is a block diagram showing data storage using the reference layer for in-plane magnetoresistive memory devices in accordance with an exemplary embodiment.

FIG. 1 illustrates two example magnetoresistive devices 100 and 150 having two different reference layer orientations. The examples illustrated in FIG. 1 are in-plane devices in that the easy axis of each of the magnetic layers included in the devices is oriented in the film-plane of the ferromagnetic layers. Magnetoresistive device 100 includes SAF 130, tunnel barrier 120, and free layer 110. The double-ended arrow in the free layer 110 indicates that it can be manipulated during normal operation between the two states in order to store data. SAF 130 includes magnetic layers 136 and 132 separated by coupling layer 134. As shown by the arrows, which represent the magnetic moments of the ferromagnetic layers, magnetic layers 136 and 132 are antiferromagnetically coupled by the coupling layer 134. As shown in FIG. 1, the SAF 130 is an unbalanced SAF in that the magnetic moment of magnetic layer 136 is greater than the magnetic moment of magnetic layer 132. As noted above, while the magnetic moments are unbalanced, sizing of the layers 132 and 136 is selected in order to cause the magnetic fields produced by such layers to cancel out at the free layer 110.

Magnetoresistive device 150 includes SAF 180, tunnel barrier 170, and free layer 160. SAF 180 includes magnetic layers 186 and 182 separated by coupling layer 184. As shown, the SAF 130 of device 100 has the opposite magnetic orientation as the SAF 180 of device 150.

Figure 2:
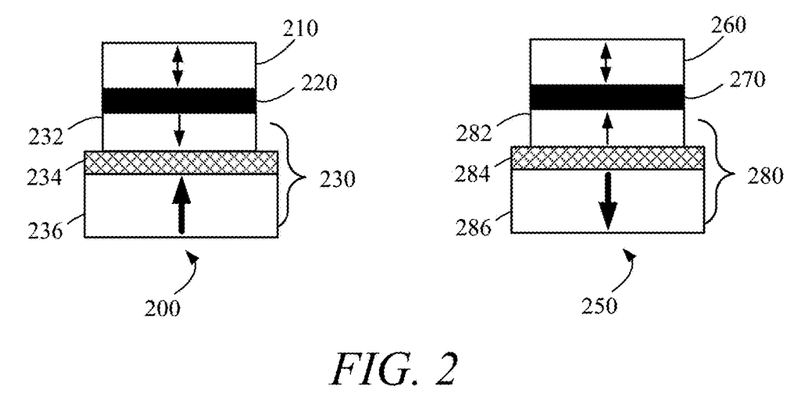
FIG. 2 is a block diagram showing data storage using the reference layer for perpendicular magnetoresistive memory devices in accordance with another exemplary embodiment.

FIG. 2 illustrates two additional example magnetoresistive devices 200 and 250 having unbalanced SAFs with different magnetic orientations. The examples illustrated in FIG. 2 are perpendicular devices in that the easy axis of the magnetic layers included in the devices is oriented perpendicular to the film plane of the layers. Magnetoresistive device 200 includes SAF 230, tunnel barrier 220, and free layer 210. SAF 230 includes magnetic layers 236 and 232 separated by coupling layer 234, which in one example is Ruthenium. As shown by the arrows, magnetic layers 236 and 232 are antiferromagnetically coupled. Similarly, magnetoresistive device 250 includes SAF 280, tunnel barrier 270, and free layer 260. SAF 280 includes magnetic layers 286 and 282 separated by coupling layer 284. As shown, the SAF 230 of device 200 has the opposite orientation as the SAF 280 of device 250.

Thus, FIGS. 1 and 2 illustrate two types of devices having unbalanced SAFs where each type of device has two different potential magnetic states for the SAF. The present disclosure uses the magnetic state of the SAF to store data and presents techniques to lower the energy barrier associated with writing data to the SAF. The state of each SAF can be selectively forced to one of the two potential states during manufacturing. For example, during wafer probing external magnetic fields, heating, and other atypical conditions are available to force the SAFs for the magnetic tunnel junctions into a desired state corresponding to the data to be stored. Such atypical conditions are not generally encountered in the normal operation of the finished part. However, because of the unbalanced SAF, the current required to cause the SAF to switch states in presence of magnetic fields can be reduced to be equal to or nearly equal to the current typically required to switch the free layer of the magnetic tunnel junctions during normal operations. As such, in some embodiments oversized selection transistors or write drivers are not required in order to facilitate data storage in the SAFs. Because of this, writing data to the SAF may be accomplished outside of the testing environment as long as the external magnetic fields can be applied.

In a typical embodiment, each memory cell includes a selection transistor coupled in series with a magnetic tunnel junction. The selection transistor allows individual memory cells to be selectively written by allowing a write current to be sent through the magnetic tunnel junction. The write current can be generated by applying a bias voltage across the memory cell. When writing to the SAF, spin-polarized electrons in the write current exhibit torque on the magnetic state of the SAF and an opposite torque on the magnetic state of the free layer. During normal operation in which the free layer is used to store information, a similar write current is used to switch the magnetization state of the free layer while the magnetization of the SAF does not change. However, when storing data in the SAF, the write current, in combination with one or more applied external magnetic fields, forces the magnetization of the SAF to a particular state. The external magnetic fields add additional torque to that being applied to the SAF by the write current such that the magnetization of the SAF is forced to the desired state. Note that the external magnetic field holds the free layer in a particular state, thereby allowing the free layer to be used to spin-polarize the electrons in the write current to exhibit the desired torque on the SAF. While the torque exhibited by the write current is not enough to cause the SAF to enter the desired magnetic state by itself, additional torque is provided by the external magnetic fields applied simultaneously with the write current. Such external magnetic fields are commonly used during manufacturing of magnetoresistive memories. Application of such fields along with the write current can be used to obtain the desired orientation of individual SAFs within the memory as the current provides for selectivity between devices on the memory so that only certain SAFs are subjected to the combined force of the spin-torque current and applied magnetic field.

Figure 3:
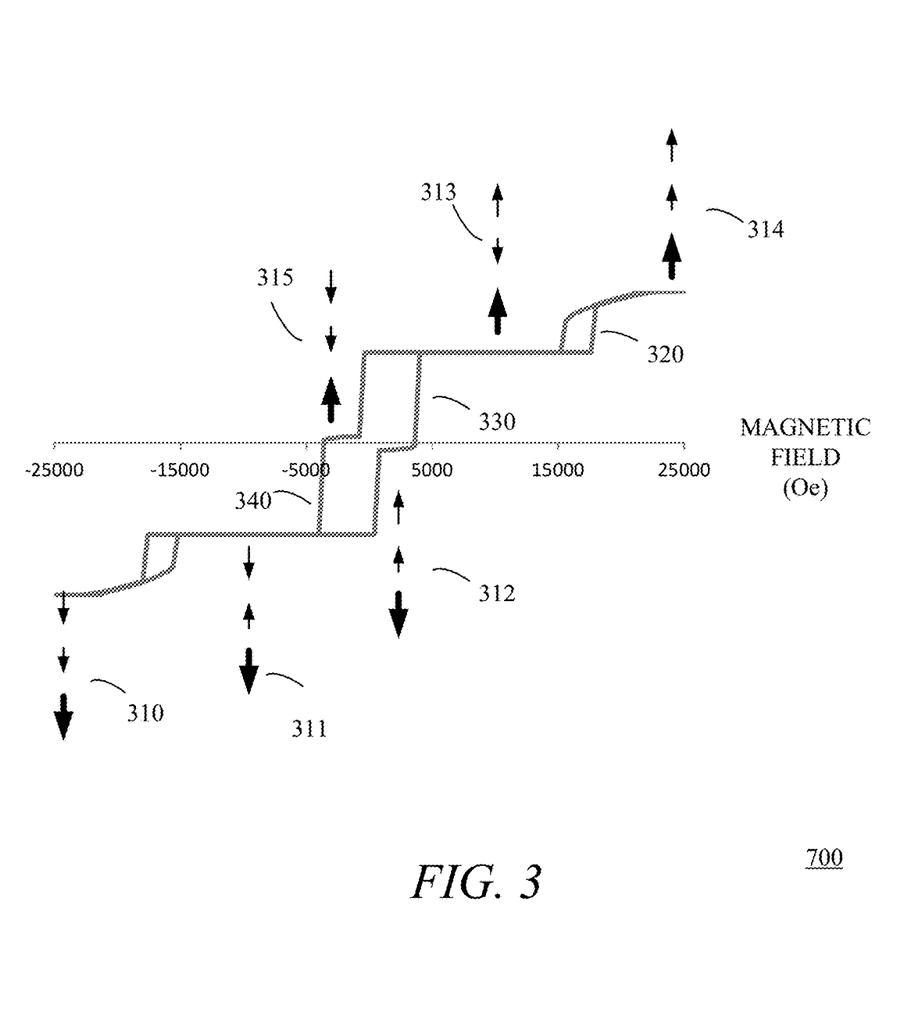
FIG. 3 is a graph that illustrates the magnetic moment transitions for a plurality of magnetic layers in a magnetic tunnel junction in accordance with an exemplary embodiment.

As noted above, providing an unbalanced SAF reduces the energy needed to cause the SAF to invert its magnetic state. FIG. 3 shows a graph corresponding to the different magnetic states for a magnetic tunnel junction that includes an unbalanced SAF such as those depicted in FIG. 2. The horizontal axis corresponds to an applied external magnetic field along the easy axis that is measured in Oersteds. Starting on the left hand side of the curve, state 310 corresponds to the saturated state in which a high-magnitude negative (e.g. downward) magnetic field is applied. In the saturated state 310, the negative magnetic field is so strong that all of the magnetic layers in the stack for the magnetic tunnel junction are oriented in the downward direction. Thus the free layer (top arrow), the upper ferromagnetic layer in the SAF (middle arrow), and the lower ferromagnetic layer in the SAF (bottom arrow) are all shown to have a downward magnetic vector.

Moving to the right on the curve, the state 311 is reached at approximately −15,000 Oe. In the state 311, the antiferromagnetic coupling between the magnetic layers in the SAF overpowers the externally applied magnetic field with respect to the upper magnetic layer in the SAF such that the upper magnetic layer in the SAF has a magnetic vector opposite that of the lower magnetic layer and thus points upwards. Continuing along the curve, once the magnetic field becomes positive and is able to influence the five layer, the free layer switches to the upward direction as is shown in state 312. Note that the positive field at this point on the curve is insufficient to cause the SAF to change state.

Because of the moment imbalance in the SAF, the curve shown in FIG. 3 includes a transition in which the magnetic state of the SAF inverts at a relatively low magnetic field in comparison to where the upper ferromagnetic layer in the SAF switches in a balanced SAF. This corresponds to the transition 330 where the SAF inverts its magnetic state such that the lower magnetic layer rotates from the downward direction to the upward direction and the upper magnetic layer in the SAF rotates from the upward direction to the downward direction. This corresponds to state 313. By tuning the magnetic moments of the magnetic layers in the SAF, the positioning of the transition 330 can be controlled to provide for switching of the SAF between states with lower energy while still ensuring robust normal operation with respect to using the free layer to store data based on a stable reference layer (i.e. the SAF does not switch unintentionally during normal operation).

As the magnetic field is increased from state 313 in FIG. 3, the magnetic tunnel junction eventually reaches the point of saturation, which corresponds to state 314 in which all of the magnetic vectors for the magnetic layers are in the upward direction. This corresponds to the transition 320 shown in FIG. 3. Moving backwards on the curve from right-to-left, once the field reaches about 15,000 Oe, the antiferromagnetic coupling of the SAF causes the upper magnetic layer in the SAF to switch to the downward direction at state 313. Continuing in the negative direction, after the field becomes negative, the free layer switches to the downward direction at state 315, and then another transition 340 corresponds to the SAF inverting to state 311 such that the lower magnetic layer rotates from up to down and the upper magnetic layer in the SAF moves from down to up. As noted above, this inversion point for the SAF is at a relatively lower level of negative magnetic field than is the case for a balanced SAF. As such, the unbalanced SAF makes it easier to cause the SAF to invert magnetic states, thereby making it easier to store data in the SAF. Continuing along the curve in the negative direction, the negative saturation state 310 is eventually reached.

While FIG. 3 illustrates the behavior of the magnetic layers within the stack of the magnetic tunnel junction when exposed to external magnetic fields, only exposing the devices to a magnetic field does not allow for selective writing of some of the SAFs to one state and writing other SAFs to the opposite state. As such, a combination of spin torque current and one or more magnetic fields is used to write data into the SAFs of the memory cells.

In some embodiments, a first current and magnetic field(s) are applied to put some of the SAFs into a first state and another current and magnetic field(s) are applied to put other SAFs into a second, opposite state. In other embodiments, the entire array of memory cells in the memory can initially have their states set to a first "reset state" so that only those cells having a data value corresponding to a second "set state" need to be written. The reset state for all cells can be realized by putting the entire wafer in a large magnetic field of sufficient magnitude to force all of the reference layers into the reset state. Later, some of the cells can be forced from the reset state to the set state using a combination of a write current and one or more external fields, where neither the write current nor the magnetic field(s) is enough to force a change of state by itself.

Figure 4:
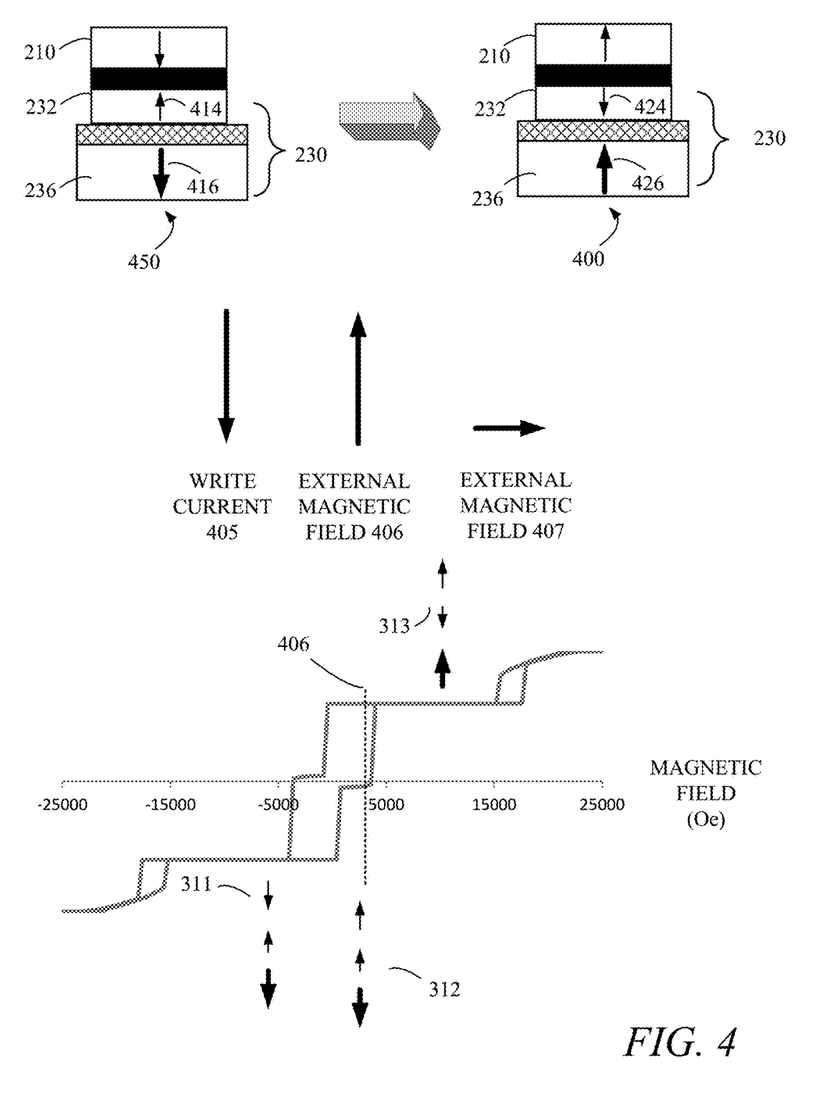
FIGS. 4 and 5 are block diagrams showing currents and magnetic fields applied to a magnetoresistive memory cell to store data in the reference layer of the memory cell in accordance with exemplary embodiments.

Turning to FIG. 4, the SAF 230 of magnetic tunnel junction 450 includes magnetic layers 236 and 232. Assuming that the magnetic tunnel junction 450 is the initial state (corresponding to state 311 in the graph at the bottom of FIG. 4) and it is desired to invert the SAF 230 to arrive at magnetic tunnel junction 400 (corresponding to state 313 in the graph), the magnetic tunnel junction 450 is exposed to the external magnetic field 406, which is oriented along the easy axis of the magnetic layers in the SAF 230. As shown in the graph near the bottom of FIG. 4, the applied external magnetic field 406 preferably corresponds to a field having magnitude shown by the dotted line. Such a field places the SAF 230 on the cusp of switching between state 312 and state 313. Assuming that the magnetic tunnel junction is a perpendicular magnetic tunnel junction, the magnetic vector corresponding to the external magnetic field is parallel to or along the Z-axis.

In addition to applying the external magnetic field 406 along the Z-axis, a smaller external magnetic field 407 that is perpendicular to the external magnetic field 406 can be applied to "nudge" the magnetic moment of the SAF out of alignment with the Z-axis to help lower the switching barrier. If the external magnetic field 406 is along the Z-axis, the external magnetic field 407 can be along the X-axis, the Y-Axis, or along some other orientation in the X-Y plane.

In order to push the SAF 230 past the threshold such that it inverts from state 312 to state 313, the write current 405 is applied through the magnetic tunnel junction 450. The spin-torque generated by the write current 405 combines with the force of the magnetic fields and causes the SAF 230 to invert such that the magnetic moments 414 and 416 of SAF 230 in magnetic tunnel junction 450 rotate 180 degrees to produce magnetic moments 424 and 426 in magnetic tunnel junction 400. The write current 405 and external magnetic fields 406 and 407 are insufficient to cause the SAF 230 to invert by themselves, and only the combined force of these stimuli cause the SAF inversion. Notably, in some embodiments, the "nudge" provided by external magnetic field 407 is unnecessary as a larger write current 405 may be employed to force the SAF 230 to invert. In yet other embodiments, the device can be exposed to elevated temperatures in order to lower the switching barrier for the SAF such that less magnetic field or current is required to switch the SAF.

In one example embodiment corresponding to FIG. 4, a semiconductor wafer containing a plurality of memories or integrated circuits with embedded magnetic memory is first placed in a strong magnetic field that forces the initial magnetic moments of all of the SAFs 230 to the an initial "reset" state corresponding to magnetic tunnel junction 450. In order to force some of the memory cells to transition to the second state, and thereby allow data storage based on one of the two states being present for each magnetic tunnel junction, the external magnetic fields 406 and 407 are applied at the same time as write current 405 is directed through the selected memory cells to write the memory cells to the second state.

Figure 5:
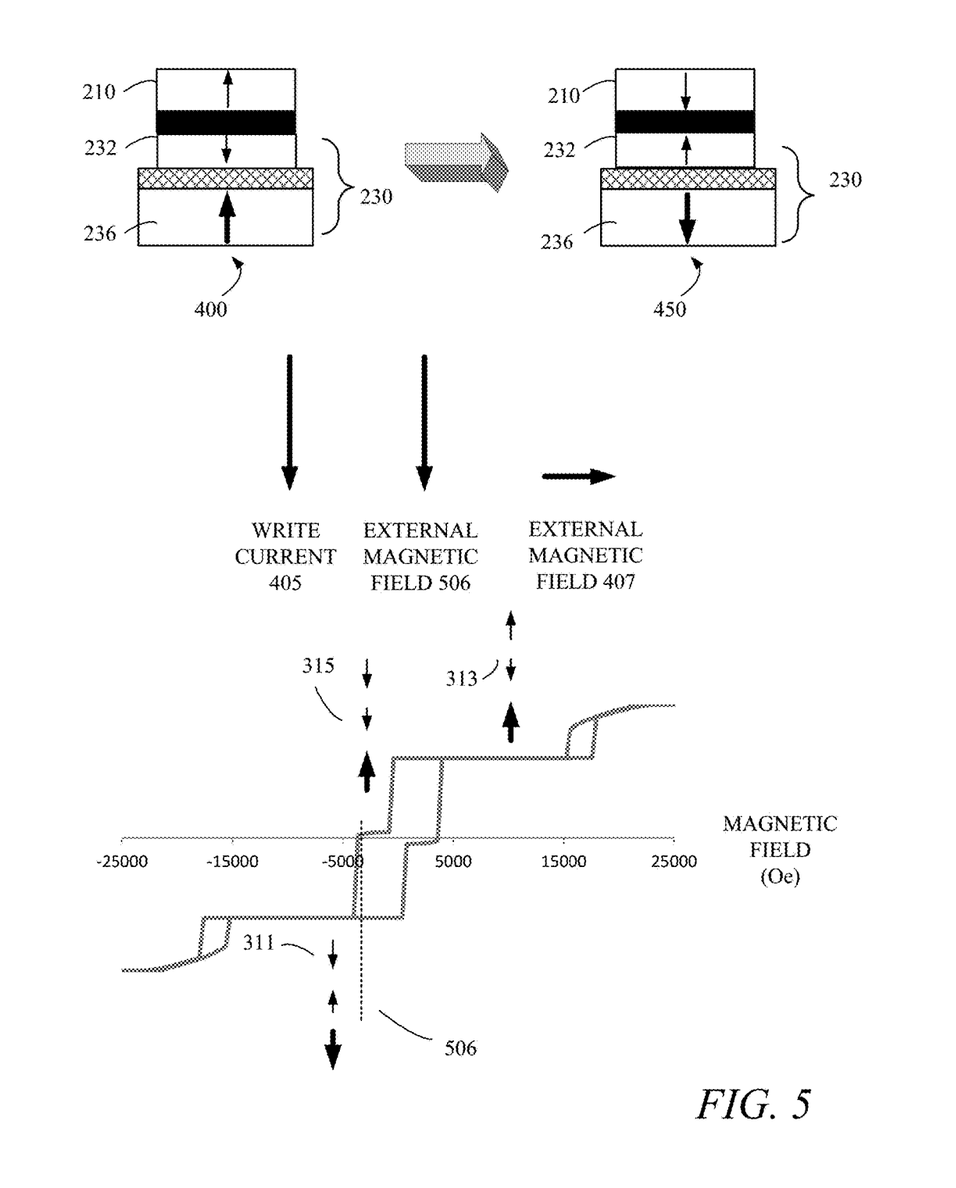

FIG. 5 illustrates the reverse transition where the SAF 230 of the magnetic tunnel junction 400 in state 313 is forced to invert to arrive at magnetic tunnel junction 450 in state 311. In FIG. 5, the external magnetic field 506 is directed downward and exerts torque on the SAF 230. However, the external field alone is inadequate to force the SAF into the state 311 and instead corresponds to the point where the SAF 230 is on the cusp of switching as per the dotted line in the graph. The perpendicular external magnetic field 407 can also be applied to "nudge" the magnetic moments of the SAF 230 out of alignment with the easy axis. As such, when write current 405 is applied, where the downward write current 405 supplements the torque induced by the magnetic fields 506 and 407, the SAF 230 is pushed past the threshold and transitions from state 315 to state 311. As noted above, the unbalanced SAF allows the SAF to invert with less required energy.

In an embodiment corresponding to FIG. 5, the wafer may initially be subjected to a strong external field in the upward direction such that the "reset state" or "first state" for the memory cells corresponds to the SAF being in the state 313. Changing that initial state to the "set state" or "second state" is accomplished by applying the downward external magnetic field 506 and the in-plane field 407 while selectively applying the write current 405 to those cells that are intended to be switched. As also noted above, instead of only using external magnetic fields to lower the switching barrier to allow for spin-torque switching of the reference layers, a combination of external magnetic fields and elevated temperature can be used together to lower the switching barrier. In other embodiments, other techniques are used to lower the switching barrier so that spin-torque switching of the reference layer is possible.

While storing data using the SAFs of the magnetic tunnel junctions in the memory cells provides more robust storage than using the free layers, even more immunity to errors can be achieved by writing the same data to multiple locations in the memory array. In one example embodiment, the same bit of data is written to three separate memory cells where a majority decision can be used to determine the value of the data bit stored. In other embodiments, each bit of data is stored in a high-low pair of memory cells where one cell is referenced to the other. In yet other embodiments, entire blocks of data can be repeated in multiple locations within the memory array. Different levels of redundancy may be appropriate in different applications.

In order to achieve an unbalanced SAF that provides for a lower switching barrier for the SAF while still maintaining proper normal operation when the free layer is used to store data, it is desirable to match the magnetic fields generated by the magnetic layers in the SAF as they are perceived by the free layer such that those fields generally cancel out and zero coupling field is seen by the free layer. Large coupling fields lead to severe imbalances of the free layer energy barrier and can lower the data retention in one particular switching direction. While the ideal situation is to have the fields from the magnetic layers in the SAF cancel perfectly so that no coupling field is seen by the free layer, one of ordinary skill in the art appreciates that some tolerance is permitted where the operation of the magnetic tunnel junction is not adversely affected by any remaining field or where the effect of such a remaining field is negligent or can be compensated for during operation.

In the magnetic tunnel junction 400 in FIG. 5, the upper magnetic layer 232 in the SAF 230 and the free layer 210 have the same diameter (assuming a circular geometry of the layers in the stack) or width, while the lower magnetic layer 236 in the SAF 230 has a greater diameter or width and is larger in area. Assuming that the magnetic layers have similar compositions, the thickness and width of the layers can be varied to tune their magnetic moments, thereby enabling an unbalanced SAF to be realized, where the magnetic moment of the one of the layers is greater than that of the other. Because the sidewalls of the upper magnetic layer 232 are closer in proximity to the free layer 210, the magnetic field generated by the upper magnetic layer will have a greater impact on the free layer 210. As such, even though the magnetic moment of the lower magnetic layer 236 is greater and will result in a greater amount of magnetic field being generated, the increased distance between the free layer 210 and the sidewalls of the lower magnetic layer 236 reduces the perceived magnitude of the field at the free layer. As such, the field generated by the upper magnetic layer 232, which has a smaller magnetic moment, can be offset and cancelled out by the field generated by the lower magnetic layer 236.

In a specific example in which the diameter of the free layer 210 and upper magnetic layer 232 are about 70 nm, the diameter of the lower magnetic layer may be on the order of 90 am in order to achieve the desired moment imbalance. Thus, in some embodiments, the width of the lower magnetic layer is about 25-30% greater than the width of the upper magnetic layer (e.g. 28.6% in the 90 nm/70 nm example). In other embodiments, the width of the lower magnetic layer is between 10% and 30% greater than the width of the upper magnetic layer. The thickness of the upper magnetic layer 232 is preferably kept very small, for example on the order of 1.7 nm. The width of the free layer 210 and upper magnetic layer 232 may be dictated by the minimum feature size for the stack, and the width of the lower magnetic layer 236 may be determined (as discussed in more detail below) based on the width of encapsulation material added to the width of the free layer 210 and lower magnetic layer 232. As such, the desired thickness of the lower layer of magnetic material 236 can be determined in order to minimize the coupling field seen by the free layer 210. In the example in which the upper magnetic layer is 70 nm wide and 1.7 nm thick, the lower magnetic layer may be 90 nm wide and 2.3 nm thick in order to achieve minimal coupling field at the free layer while providing a significant SAF moment imbalance. Notably, for different widths of the lower magnetic layer, different thicknesses can be used to tune the moment imbalance to result in little or no coupling field at the free layer 210.

Figure 6:
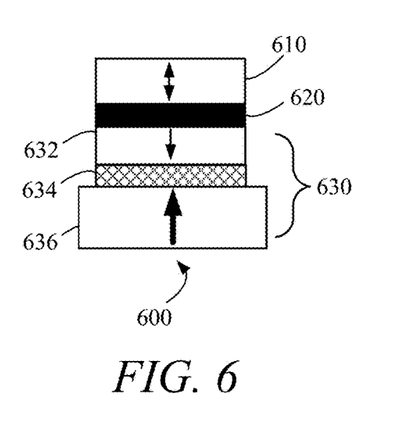
FIGS. 6-9 are block diagrams showing different unbalanced synthetic antiferromagnet geometries in accordance with exemplary embodiments.

In the embodiment of FIG. 5, the top portion of the stack, which includes free layer 210 and upper magnetic layer 232, can be formed using a first etch, whereas the lower portion of the stack, which includes the lower magnetic layer 236 is formed using a second etch. In other embodiments, the etch profile of the magnetic tunnel junction stack shown in FIG. 5 can be modified while still achieving the desired moment imbalance with a coupling field that is approximately zero at the free layer. For example, in FIG. 6, the magnetic tunnel junction 600 has a slightly different geometry than that depicted in FIG. 5. In the magnetic tunnel junction 600, the first etch continues further down the stack such that the width of the antiferromagnetic coupling layer 634 matches the width of the free layer 610, the dielectric layer 620 that forms the tunnel barrier layer, and the upper magnetic layer 632 of the SAF 630. Notably, while a simplified magnetic stack is illustrated for the magnetic tunnel junctions shown, each magnetic tunnel junction can contain many additional layers, including spacer layers, ferromagnetic layers, and coupling layers.

Figure 7:
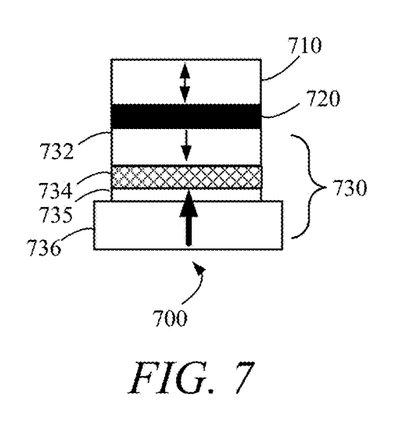

In FIG. 7, the magnetic tunnel junction 700 has a geometry in which a portion of the lower layer of magnetic material 735 of the SAF 730 is narrower and has a width corresponding to the layers 710, 720, 732, and 734, while another portion of the lower layer of magnetic material 736 has a greater width in order to help achieve the desired moment imbalance. In such an example, a first etch can be used to etch layers 710, 720, 732, 734 and 735, where a second etch is used for layer 736.

Figure 8:
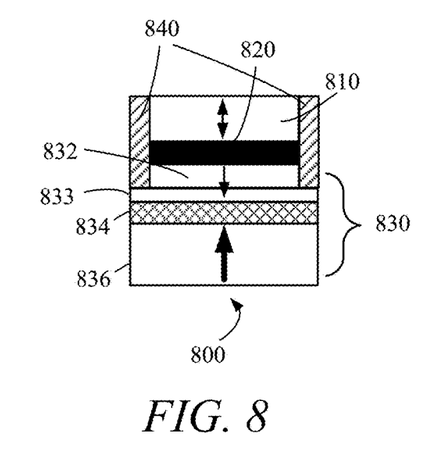

In FIG. 8, the upper layer of magnetic material in the SAF 830 has two portions 832 and 833, where portion 833 has the same width as layers 834 and 836 and where portion 832 has the same width as layers 810 and 820. In such an example, a two-step etch using a single mask can be used to achieve the desired geometry. After the mask is established, a first etch forms layers 810, 820, and 832. Following the first etch, encapsulation material 840 is deposited or otherwise formed on the sidewalls of the partially etched stack. The second etch, which follows encapsulation, uses the encapsulation as additional masking such that the layers 833, 834, and 836 are formed with a greater diameter or width than that of the layers formed during the first etch. Thus, for the example discussed above where the width of an upper portion of the stack is 70 nm, the encapsulation material can be 10 nm wide on each sidewall of the upper portion of the stack to produce a lower portion of the stack that is 90 nm wide.

Figure 9:
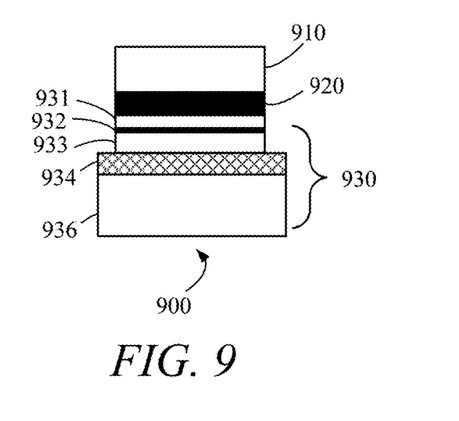

FIG. 9 illustrates a magnetic tunnel junction 900 in which the upper layer of magnetic material in the SAF 930 is shown to include three layers. A first layer 931 is separated from a second layer 933 by a non-magnetic spacer layer 932. In one embodiment, these layers are 70 nm wide and the first layer 931 is CoFeB, the second layer is 933 is (Co/Pt), and the spacer layer between those layers is Ta. In such an embodiment, the thickness of the first layer is 0.9 nm, the thickness of the spacer layer 932 is 0.3 nm, and the thickness of the second layer is 0.5 nm for total thickness of 1.7 nm. Assuming that the lower magnetic material is also CoPt and is 90 nm wide, a thickness of 2.3 nm can be used to achieve the desired moment imbalance with near zero or zero coupling field at the free layer.

The moment imbalance strongly affects the applied field at which the SAF rotates, "H(SAF rotate)," which corresponds to the transition 330 in FIG. 3. In order to achieve low failure rate of SAF inversion process, it is desirable to optimize the moment imbalance to have adequate separation between the switching field of the free layer, "H(FL switch)", and H(SAF rotate), and also adequate separation between H(SAF rotate) and the applied field at which the upper magnetic layer in the SAF switches and the magnetic tunnel junction is saturated, "H(SAF saturate)," which corresponds to the transition 320 in FIG. 3. Each of the field values, H(FL switch), H(SAF rotate), and H(SAF saturate) has a bit-to-bit distribution in an array. In other words, different memory cell in the array will have different values for these parameters. The low end tail of H(SAF saturate) should be larger than the high end tail of H(SAF rotate); the low end tail of H(SAF rotate) should be larger than the high end tail of H(FL switch). Moreover, the six-sigma distribution of the SAF switching field and saturation field should not intersect.

Once the data is stored in the SAFs of the memory cells on the integrated circuit, it can later be retrieved for use. For example, the data stored in the SAFs can be programmed at testing and then retrieved after the part is soldered onto a board or into a system and used as initialization or some other form of start-up code. Techniques for reading the data stored in the SAFs are disclosed in co-pending U.S. patent application Ser. No. 15/087,469, which has been incorporated by reference herein.

While the examples in FIGS. 2-9 correspond to perpendicular memory devices, in-plane memory devices such as those depicted in FIG. 1 can also be used where data is stored in the reference layer. Programming such in-plane memory devices includes externally applied magnetic fields with simultaneous spin-torque current. The external magnetic fields are selected to be insufficient to change the reference layer without the supplementary force provided by spin-torque current. The combination of the magnetic fields and spin-torque currents force the reference layer to assume a selected orientation that can later be detected using the free layer as a reference.

The discussion above focuses on programming the states of the reference layer during manufacturing as magnetic fields, higher temperatures, and electrical access to the memory cells is readily available during manufacturing (e.g., at wafer probe). However, such programming can be performed after manufacturing is completed given proper programming conditions.

Figure 10:
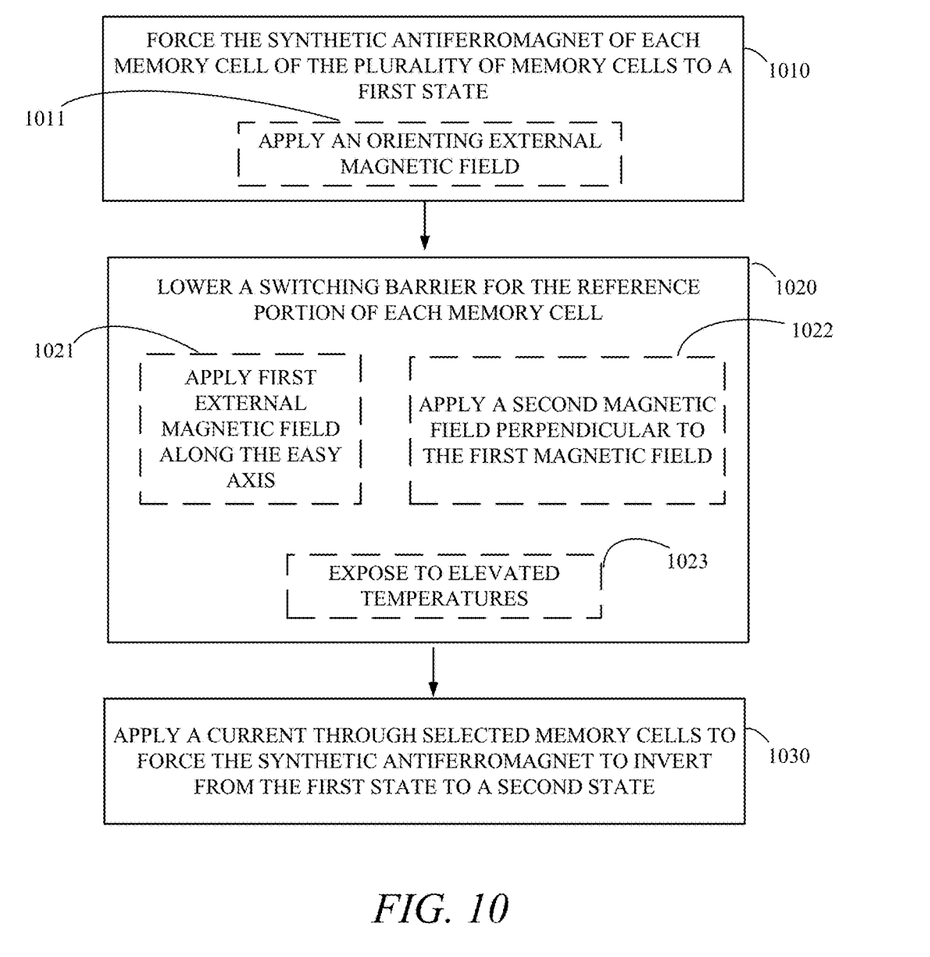
FIG. 10 is a flow chart illustrating a method of operation of a memory device in which data is stored in the reference layer in accordance with exemplary embodiments.

FIG. 10 is a flow chart that illustrates exemplary embodiments of methods of operation of magnetoresistive memory devices in which data is stored in the orientation of the magnetic moment of the reference layers in the memory devices. The operations included in the flow charts may represent only a portion of the overall process used in operating the memory. For illustrative purposes, the following description of the methods in FIG. 10 may refer to elements mentioned above in connection with FIGS. 1-9. It should be appreciated that methods may include any number of additional or alternative tasks, the tasks shown in FIG. 10 need not be performed in the illustrated order unless specified otherwise, and the methods may be incorporated into a more comprehensive procedure or process having additional functionality not described in detail herein. Moreover, one or more of the tasks shown in FIG. 10 can be omitted from an embodiment as long as the intended overall functionality remains intact.

Figure 11:
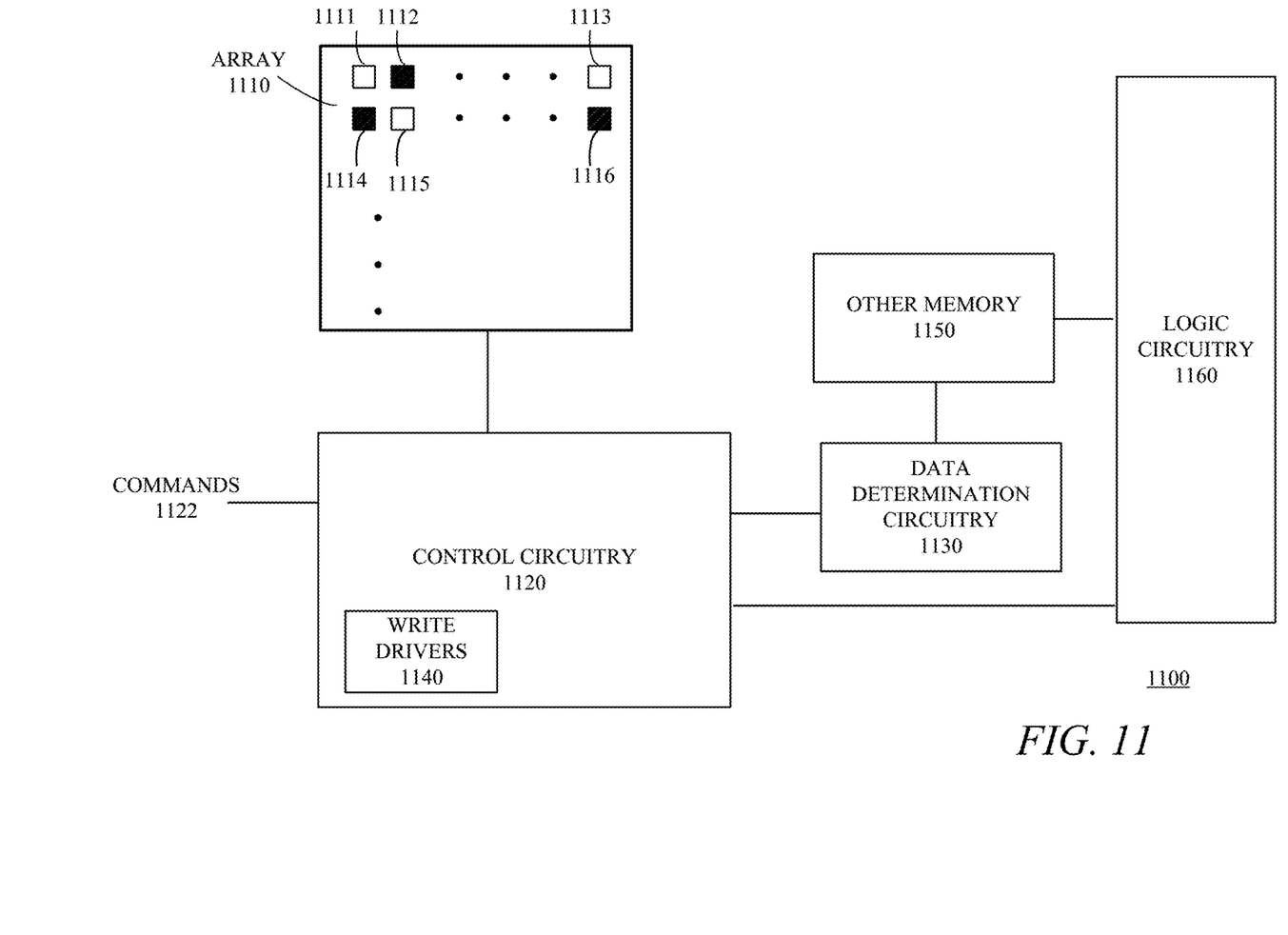
FIG. 11 is a schematic diagram of a portion of an integrated circuit that includes memory cells storing data in the reference layer in accordance with another exemplary embodiment.

FIG. 10 illustrates a flow chart of a method for operating a magnetoresistive memory in which data is stored based on the orientation of the SAFs of at least a portion of the memory cells included in the memory. The memory may be a stand-alone MRAM memory or part of an integrated circuit that includes additional logic circuitry. FIG. 11 illustrates a block diagram of a portion of such an integrated circuit and some of the circuitry that is included in some embodiments.

In FIG. 10, data is stored in the SAF of one or more memory cells in the memory, thereby providing for more robust storage that can tolerate exposure to higher temperatures and magnetic fields without losing data. At 1010, the SAF of each memory cell in the memory is forced into a first, known state. In an in-plane memory device example, the orientation of the magnetic moments of the SAFs of all of the memory cells are forced to point to the right as shown in the memory cell 100 depicted in FIG. 1. In some embodiments, this is accomplished at 1011 by applying an orientating external magnetic field of sufficient magnitude to reset the orientations of all of the SAFs. In other embodiments, a combination of an orienting external magnetic field and elevated temperature is used to force the orientations of all of the SAFs to a predetermined state. This is considered to be the "reset" state for each of the memory cells.

At 1020, the switching barrier for the reference portion of each memory cell is lowered. In other words, the memory is subjected to conditions that make the magnetic states of the SAFs more susceptible to modification. Such conditions can include applying a first external magnetic field along the easy axis at 1021 (e.g. similar to magnetic field 406 in FIG. 4), applying a second magnetic field perpendicular to the first magnetic field at 1022 (e.g. the "nudge" of magnetic field 407 in FIG. 4), and exposing the memory device to elevated temperatures at 1023. While higher temperatures and magnetic fields can be applied to the device at any point in time, such conditions are readily available during testing operations such as wafer probe or burn-in. As noted above, the conditions applied preferably place the SAF on the verge of switching from the reset state to the set state. In other words, the magnetic fields and heat applied are preferably such that a small amount of spin-torque current is all that is required to push the SAF over the threshold and cause it to invert.

Once the switching barrier has been lowered, a current is applied at 1030 through selected memory cells to force the SAF of the selected memory cells to switch from the first state (reset) to a second state (set). Thus, as discussed above, while the magnetic fields and/or heat applied at 1020 lowers the switching barrier of the SAF, those conditions are insufficient to change the magnetic moment of the SAF without the additional torque provided by the spin-torque current applied at 1030. The spin-torque current applied to selected cells at 1030 allows some memory cells to be left in the first, "reset" state, whereas others are forced to the second, "set" state. This provides for more robust data storage in which the first state corresponds to one binary value, whereas the second state corresponds to the other binary value.

Note that while the example embodiment of FIG. 10 places all of the memory devices in the "reset" state initially, in other embodiments, that step can be omitted. In such embodiments, a first set of magnetic fields can be applied along with a first current to place some of the memory cells in to the first state, whereas a second set of magnetic fields and a second current is used to place other memory cells into the second state.

Data stored in the reference layers of memory cells according to methods such as that shown in FIG. 10 can be recovered using methods such as those described in detail in co-pending U.S. patent application Ser. No. 15/087,469. Briefly, the free portion of a selected memory cell is forced to a known state corresponding to a known orientation of the magnetic portion of the free portion. In some embodiments, this is accomplished by exposing the memory device to an external magnetic field. Once the free portion has been oriented to a known state at, the initial resistance through the selected memory cell is sampled. Sampling the resistance can include applying a bias voltage across the memory cell and detecting the magnitude of a resulting current through the memory cell. After sampling the initial resistance, a write current is applied through the selected memory cell, where the write current can be an up-current or a down-current flowing vertically through the magnetic tunnel junction of the memory cell. Depending on the orientation of the reference portion of the memory device, the current applied may or may not cause the free portion of the memory cell to change state. After applying the write current, the resulting resistance through the memory cell is sampled and the state of the SAF of the selected memory cell is determined based on a comparison between the initial resistance and the resulting resistance determined after the current is applied.

FIG. 11 is a block diagram of a portion of an integrated circuit 1100 that includes a plurality of non-volatile memory cells 1111-1116 that are included in an array 1110. Each of the memory cells 1111-1116 includes a free portion and an unbalanced SAF as discussed above. In the example illustrated, a first set of memory cells 1111, 1113, and 1115 includes memory cells having a SAF with a first magnetic state (e.g. as depicted in memory cell 100 of FIG. 1 or memory cell 200 of FIG. 2). A second set of memory cells 1112, 1114, and 1116 includes memory cells having a reference portion with a second magnetic state (e.g. as depicted in memory cell 150 of FIG. 1 or memory cell 250 of FIG. 2).

Control circuitry 1120 is coupled to the array 1110 and asserts the control signals to the portions of the array and other circuitry on the memory device that are used to determine the orientation of the SAFs of the memory cells such that the data stored therein can be recovered. The control circuitry can include a write driver 1140, sense amplifiers, row and column selection circuitry, etc. Because reading the data stored in the SAFs of the memory cells includes operations that are also associated with reading and writing data based on the magnetic state of the free portions of the memory devices, in some embodiments, the control circuitry 1120 also controls such operations that store and retrieve data in the free layers. For example, in some embodiments, control circuitry 1120 is configured to write data into a selected memory cell by applying a write current (e.g. up-current or down-current) through the memory cell to force the free portion of the memory cell to have a magnetic moment that is either parallel or anti-parallel to the reference portion of the memory cell. In some embodiments, the same write drivers 1140 used to store data in the free portions of the memory cells are used to store data in the SAFs when the integrated circuit 1100 is exposed to magnetic fields and/or heat to reduce the switching threshold of the SAFs as discussed above. Thus, the current applied to switch the SAFs may be about equal to the current applied to store data in a free layer during normal operation.

Reading data stored in the free portion can be accomplished by a self-referenced read operation that determines whether the magnetic moment of the free portion is parallel or antiparallel to that of the upper magnetic layer in the SAF. Such reading and writing operations can be performed in response to commands 1122 received by the control circuitry.

As noted above, in other embodiments, data robustness can be further enhanced by including data determination circuitry 1130 on memory device 1100. Data determination circuitry 1130 is configured to determine individual bits of data from the state of the reference portions of multiple memory cells. For example, each of bits 1111-1113 may correspond to one-half of a corresponding high-low pair of memory cells, where the other half corresponds to one of memory cells 1114-1116. Thus each pair of memory cells 1111 and 1114, 1112 and 1115, and 1113 and 1116 stores a single bit of information, where the first memory cell in each pair is referenced to the second memory cell. Thus, pair 1111 and 1114 stores the same data bit (e.g. "0") as pair 1113 and 1116, whereas pair 1112 and 1115 stores a different data bit (e.g. "1"). Pair 1111 and 1114 have the first memory cell 1111 in a first state and the second memory cell 1114 in the second state, whereas pair 1112 and 1115 is the opposite in that the first memory cell 1112 is in the second state and the second memory cell 1115 is in the first state.

In other embodiments, the data determination circuitry 1130 acts as a majority detector to determine a single bit of data from multiple memory cells. While storing the data in the reference portion a memory cell is more robust in terms of heat and magnetic field tolerance than storage using the free portion, in some embodiments, the data stored in even the reference portion of some memory cells may be compromised. For example, all of memory cells 1111-1113 may have been intended to store the same state, but memory cell 1112 was compromised during an operation such as burn-in or wave soldering. If each of memory cells 1111-1113 stored a single bit of data by itself, the data bit stored in memory cell 1112 would be compromised. However, if a single bit of data is stored by forcing the SAFs of all three of memory cells 1111-1113 into the same state, a majority determination can be used to determine the stored data bit such that errors in less than half of the memory cells would still result in valid data being recovered. For example, because both memory cells 1111 and 1113 retain the desired state, the majority detector will override the error in memory cell 1112 and recover the correct data bit stored by memory cells 1111-1113. Other redundant data storage techniques can be used in association with data storage in the SAFs of memory cells in order to provide robust ROM-like data storage that is less-susceptible to corruption.

Integrated circuit 1100 is also shown to include other memory 1150 and logic circuitry 1160. In some embodiments, the integrated circuit does not include these blocks and has the primary function of serving as a magnetic memory. In some embodiments, the logic circuitry 1160 includes a processor, microcontroller, or other logic circuits that utilize the data stored in the SAFs of the memory cells in the array 1110. For example, the logic circuitry 1160 may cause the data to be recovered from the SAFs of the memory cells and then stored in either the free layers of the memory cells in the array 1110 or in memory cells in the other memory 1150, which may be FLASH, SRAM, DRAM, etc., for access during normal operation. The data stored in the SAFs can be used for startup operations or other operations that would benefit from ROM-like storage that survives the high temperature operations associated such as wave soldering.

By storing data in the SAFs of magnetic memory cells, more robust data retention is possible, thereby allowing data programmed during manufacturing of a memory to be retained after packaging and soldering onto a system printed circuit board. The underlying data stored in the SAF does not interfere with the ability of the free layer to be used for read/write operations as in conventional MRAMs. As such, each memory cell can be used to store a first bit of data in the SAF of the magnetic tunnel junction and a second bit of data in the free layer of the magnetic tunnel junction. Tuning the geometry of the SAF to provide an unbalanced SAF with little or no coupling field perceived by the free layer allows for easier writing to the SAF without interfering with the normal operation of the memory cell in which the free layer is used to store data.

Although the described exemplary embodiments disclosed herein are directed to various magnetoresistive-based devices, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive device, comprising:
   a free layer;
   a synthetic antiferromagnetic (SAF) reference layer that includes:
      a first ferromagnetic layer having a first magnetic moment;
      a second ferromagnetic layer having a second magnetic moment different than the first magnetic moment of the first ferromagnetic layer; and
      an antiferromagnetic coupling layer between the first and second ferromagnetic layers, wherein the antiferromagnetic coupling layer provides antiferromagnetic coupling between the first and second ferromagnetic layers; and
   a dielectric layer between the SAF reference layer and the free layer, wherein a magnetic field produced by the first and second ferromagnetic layers is perceived as approximately zero by the free layer, wherein the first ferromagnetic layer is between the free layer and the second ferromagnetic layer, and wherein the SAF reference layer is configured to store ROM-like data.

2. The magnetoresistive device of claim 1, wherein a width of at least a portion of the second ferromagnetic layer is greater than a width of at least a portion of the first ferromagnetic layer.

3. The magnetoresistive device of claim 2, wherein the first ferromagnetic layer has a first width and the second ferromagnetic layer has a second width, wherein the second width is greater than the first width.

4. The magnetoresistive device of claim 3, wherein the free layer and the dielectric layer each have a width equal to the first width.

5. The magnetoresistive device of claim 4, further comprising encapsulating material on sidewalls of at least a portion of the free layer and the dielectric layer, wherein the second width corresponds to the first width added to a width of the encapsulation material.

6. The magnetoresistive device of claim 3, wherein the second width is between 10% and 30% greater than the first width.

7. The magnetoresistive device of claim 1, wherein the magnetoresistive device is included in a magnetic memory cell.

8. The magnetoresistive device of claim 7, wherein the magnetoresistive device is included in a perpendicular spin torque memory cell.

9. The magnetoresistive device of claim 1, wherein the second ferromagnetic layer includes a first layer and a second layer separated by a non-magnetic spacer layer.

10. A method for storing data in a magnetoresistive device comprising a free layer and an unbalanced synthetic antiferromagnet (SAF), wherein the data is stored in the unbalanced SAF, the method comprising:
    applying a non-saturating first magnetic field along an axis corresponding to an easy axis of the magnetoresistive device, wherein the easy axis corresponds to a direction of magnetic vectors of the unbalanced SAF in a relaxed state, wherein the unbalanced SAF includes:
       a first ferromagnetic layer having a first magnetic moment and a first magnetic vector;
       a second ferromagnetic layer having a second magnetic moment and a second magnetic vector, wherein the second magnetic moment is different than the first magnetic moment of the first ferromagnetic layer; and
       an antiferromagnetic coupling layer between the first and second ferromagnetic layers, wherein the antiferromagnetic coupling layer provides antiferromagnetic coupling between the first and second ferromagnetic layers such that in a non-saturated state the first magnetic vector is opposite the second magnetic vector;
    while applying the first magnetic field, applying a second magnetic field perpendicular to the first magnetic field, wherein the first magnetic field is stronger than the second magnetic field; and
    while applying the first and second magnetic fields, applying a current through the magnetoresistive device, wherein spin-torque resulting from the current being spin-polarized by the free layer forces the magnetic vectors in the unbalanced SAF to invert such each of the first and second magnetic vectors rotates 180 degrees.

11. The method of claim 10, further comprising applying heat while applying the first and second magnetic fields and the current, wherein the heat lowers a switching barrier for the unbalanced SAF.

12. The method of claim 10, wherein the current is about equal to a switching current applied to store data in a free layer in the magnetoresistive device during normal operation, and wherein the first magnetic field is less than a switching field that causes the unbalanced SAF to invert without the presence of the current applied to switch the unbalanced SAF.

13. The method of claim 10, further comprising:
    prior to applying the non-saturating first magnetic field, applying an orienting magnetic field, wherein the orienting magnetic field forces the unbalanced SAF into a known state.

14. The method of claim 10, wherein the current and the first and second magnetic fields are applied during wafer probing corresponding to testing an integrated circuit within which the magnetoresistive device is included.

15. The method of claim 10, wherein the current and the first and second magnetic fields are applied during burn-in operations corresponding to a packaged integrated circuit within which the magnetoresistive device is included.

16. An integrated circuit, comprising:
    a magnetic memory cell that includes a magnetic tunnel junction, wherein the magnetic tunnel junction includes:
       a free layer;
       a synthetic antiferromagnetic (SAF) reference layer that includes:
          a first ferromagnetic layer having a first magnetic moment;
          a second ferromagnetic layer having a second magnetic moment different than the first magnetic moment of the first ferromagnetic layer; and
          an antiferromagnetic coupling layer between the first and second ferromagnetic layers, wherein the antiferromagnetic coupling layer provides antiferromagnetic coupling between the first and second ferromagnetic layers; and a dielectric layer between the SAF reference layer and the free layer, wherein magnetic field produced by the first and second ferromagnetic layers is perceived as approximately zero by the free layer, and wherein the first ferromagnetic layer is between the free layer and the second ferromagnetic layer;

a write driver selectively coupled to the magnetic memory cell, wherein the write driver provides a write current, wherein, in conjunction with at least one external magnetic field, the write current is used to store data in the SAF reference layer, and wherein, during normal operation, data is stored in the free layer of the magnetic memory cell using the write current.

17. The integrated circuit of claim 16, further comprising read circuitry coupled to the magnetic memory cell, wherein the read circuitry retrieves data from the SAF reference layer.

18. The integrated circuit of claim 16, wherein the magnetic memory cell is included in a magnetic memory device that includes a plurality of magnetic memory cells in an array.

19. The integrated circuit of claim 16, wherein the magnetic memory cell is included in a plurality of magnetic memory cells included on the integrated circuit, and wherein the integrated circuit further comprises logic circuitry.

20. The integrated circuit of claim 16, the magnetic memory cell stores a first bit of data in the SAF reference layer of the magnetic tunnel junction, and wherein the magnetic memory cell stores a second bit of data in the free layer of the magnetic tunnel junction.

* * * * *